United States Patent [19]

Jones

[11] Patent Number: 5,146,412
[45] Date of Patent: Sep. 8, 1992

[54] METHOD AND MEANS FOR SENSING A CHANGE IN CAPACITANCE BY A COMPUTER

[76] Inventor: Thad M. Jones, 1302 High St., South Bend, Ind. 46618

[21] Appl. No.: 524,746

[22] Filed: May 17, 1990

[51] Int. Cl.⁵ ............................................. G01R 27/00
[52] U.S. Cl. ..................................... 364/482; 324/678
[58] Field of Search .................. 324/678; 364/482, 556

[56] References Cited

U.S. PATENT DOCUMENTS

| | | | |
|---|---|---|---|
| 4,743,837 | 5/1988 | Herzog | 324/678 X |
| 4,829,458 | 5/1989 | Russo et al. | 364/557 X |
| 4,841,458 | 6/1989 | Levine et al. | 324/607 X |
| 4,864,513 | 9/1989 | Levine et al. | 364/482 |

Primary Examiner—Parshotam S. Lall
Assistant Examiner—Edward R. Cosimano
Attorney, Agent, or Firm—James D. Hall

[57] ABSTRACT

A method and means for using a computer for sensing a capacitive change in a sensor having a capacitive impedance component. The sensor is connected between the input and output ports of a computer which produces a periodic waveform at the output port and monitors the capacitor's discharge or charge time at its input port. The monitored times are compared to previous monitored times wherein a change in time indicates a change in capacitance.

2 Claims, 4 Drawing Sheets

5,146,412

METHOD AND MEANS FOR SENSING A CHANGE IN CAPACITANCE BY A COMPUTER

SUMMARY OF THE INVENTION

This invention relates to a method of using a computer to sense capacitance.

The method of this invention senses a capacitive impedance change of a load connected between the computer's input and output ports. A periodic waveform is placed on the output port for indirectly producing AC current to the load. The computer monitors the output of the load at the computer's input port. As the capacitive component of the load charges to a predetermined threshold level, the input port of the computer changes between a logical zero and a logical one value. The computer continually samples the status of the input port and stores information as to the charge time of the capacitive component. A change in charge times indicates to the computer a change in capacitance has occurred. If the particular computer use includes internal pull-up resistors at its input port the charge time of the capacitive component of the load is monitored.

The method of this invention is particularly useful for directly interfacing a substantially capacitive moisture sensor to a computer. Since the sensing task is accomplished without passing a DC current through the sensor and by using an excitation frequency well above 100 Hz, polarization is prevented which could damage a sensor and could cause calibration uncertainty.

Accordingly, it is an object of this invention to provide for a novel method for sensing a change in capacitance within a load.

Another object of this invention is to provide for a novel method of detecting capacitive change in a sensor.

Still another object of this invention is to provide for a capacitance sensor which prevents polarization of a sensor.

Other objects of this invention will become apparent upon a reading of the following description taken with the accompanying drawings.

DESCRIPTION OF THE PREFERRED EMBODIMENTS

The preferred embodiments herein depicted are not intended to be exhaustive or to limit the application to the precise forms disclosed. Rather they are chosen and described so that others skilled in the art might utilize the teachings of this invention.

Figure 1:
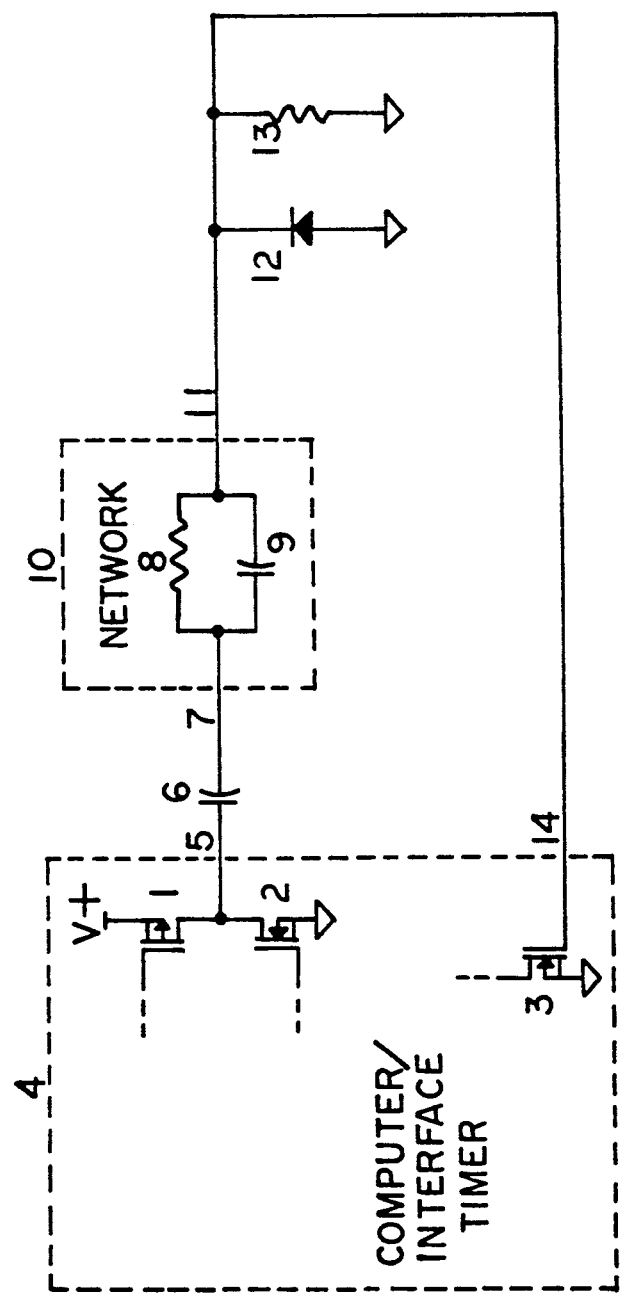
FIG. 1 is a schematical view of one embodiment of the circuitry required for practicing the method of this invention connected to a common moisture sensor or other capacitive sensor and microcontroller-type computer.

Referring now to FIG. 1 a common microcontroller or computer 4 is illustrated in block diagram form only and includes an output port 5 and input port 14. As is common, the output port 5 is driven by complementary symmetry output stage consisting of an N-channel metal oxide semiconductor field effect transistor (MOSFET) 2 and an P-channel MOSFET 1. This configuration is very common in integrated circuits employing MOS technology. So configured a logical zero at computer output port 5 indicates that MOSFET 2 is conducting current in a saturated mode and MOSFET 1 is blocking current or otherwise is turned off. A logical one at the output port 5 of the computer 4 indicates that MOSFET 2 is turned off and MOSFET 1 is conducting current in a saturated mode. Typically the dynamic impedance of the output port 5 is small and negligible when compared to the external impedances of the loads. The supply voltage (V+) assumed for all electronic circuits illustrated is typically 3 to 6 volts.

The input port 14 of computer 4 typically includes a N-channel MOSFET 3 having its gate lead connected to the input port 14. Typically, MOSFET 3 exhibits a threshold voltage in the range between 1 volt to ½ of the V+ voltage supply. At input voltages above the threshold value, MOSFET 3 conducts which places a logical one at the input port 14. At input voltages below the MOSFET's threshold value the MOSFET is in a nonconductive mode which places a logical zero at input port 14 of the computer.

A capacitor 6 is connected between computer output port 5 and input lead 7 of sensor 10. Lead 11 of sensor 10 is connected to input port 14 of computer 4. As illustrated in FIG. 1 a diode 12 and resistor 13 is connected between sensor lead 11 and a ground potential in a parallel configuration. The equivalent circuit for sensor 10 is illustrated in schematical form as including a parallel capacitive component 9 and resistor component 8 combination. For the purposes of this discussion it is assumed that the capacitive component impedance predominates over resistive component 8.

Figure 3:
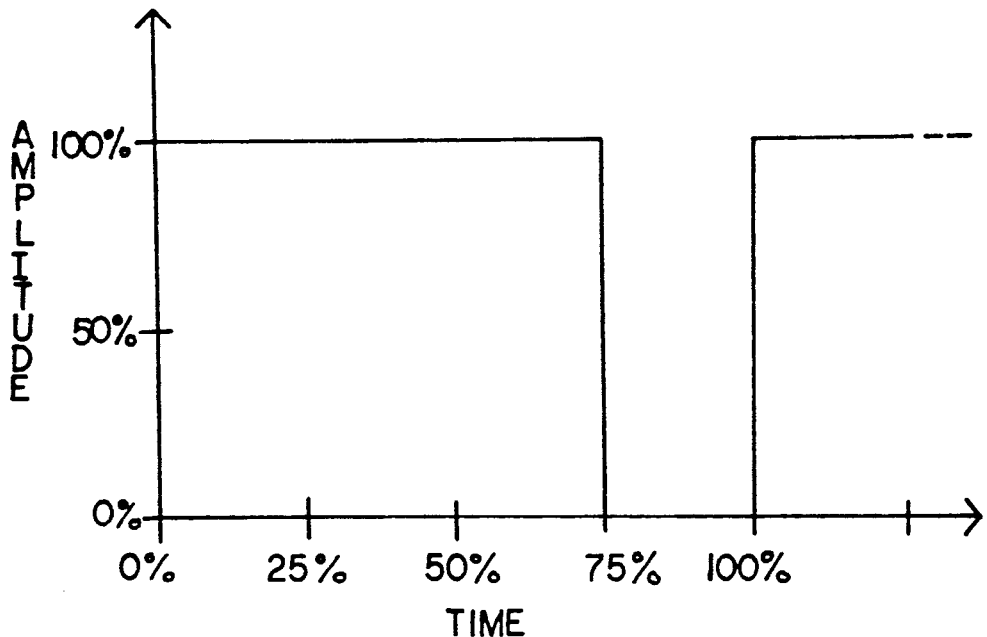
FIG. 3 is a time vs. amplitude diagram of a periodic waveform produced at the output port of the computer practicing the firsts embodiment of this invention.

In operation, computer 4 causes the periodic waveform illustrated in FIG. 3 to appear at output port 5 in a common manner. The waveform at output port 5 is preferably above 100 Hz and indirectly provides an AC current to the sensor for detecting the impedance of sensor 10. The exact duty cycle of this waveform depends substantially upon the capacitance measurement resolution desired, the computer speed and the values of the various electronic components within the sensor circuit. Capacitor 6 connected between the computer and the sensor is included to prevent the DC current from flowing through the sensor which in combination with the waveform frequency eliminates polarization and plating problems which cold degrade sensor calibration, accuracy and reliably. The period waveform of FIG. 3 on output port 5 is presented to the input 7 of sensor 10 which as explained previously has in the illustrated embodiment an impedance consisting of resistive component 8 and a capacitive component 9. The impedance values of the resistive and capacitive components vary as typical for the detection of water, humidity, position or pressure, etc. It should be understood that the references to 0% to 100% on the amplitude axis indicate percentage of the V+ voltage supply. The designations of 0%–100% on the time axis of the graphs in FIGS. 3 through 6 indicate time as a function of the percentage of the overall output waveform period.

Figure 4:
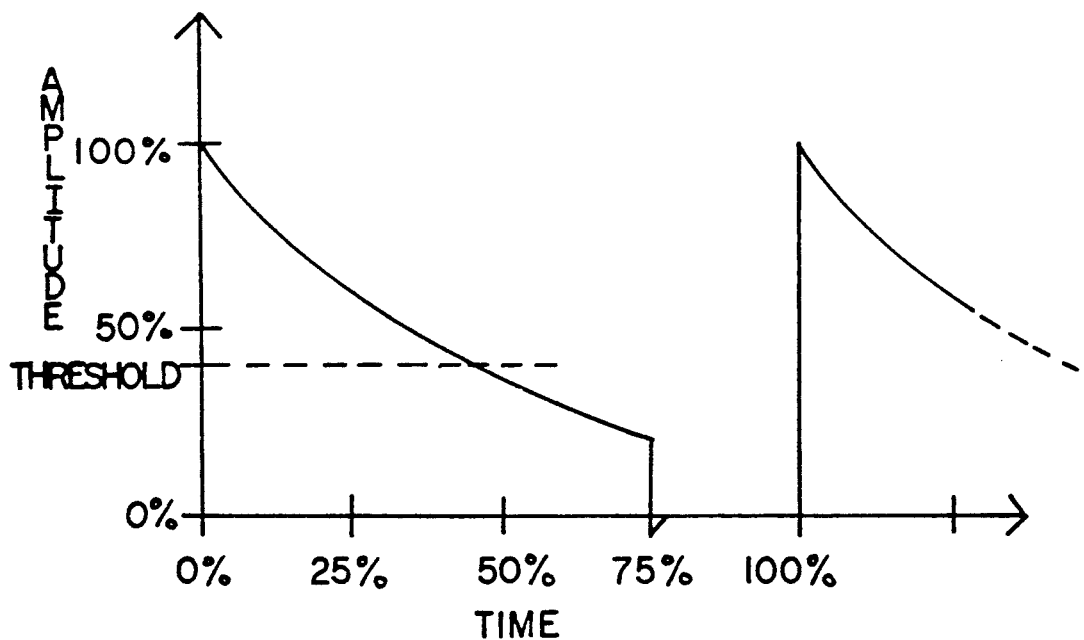
FIG. 4 is a time vs. amplitude diagram of a waveform appearing at the computer input port practicing the first embodiment of this invention.

FIG. 4 indicates the waveform received by the computer at input port 14 from sensor 10 in response to the output waveform of FIG. 3. It should be noted that at the beginning of the output waveform period i.e. 0% in the time axis, the voltage at the output port 5 makes a logical low to high transition of voltage. When the output makes its low to high voltage transition, capacitor 6 and capacitive component 9 begin to charging through resistor 13. It is assumed the value of capacitor 6 is larger than the component 9 and therefore the effect of capacitive component 9 will predominate. The charging current waveform of sensor 10 is illustrated in FIG. 4.

Assume that the capacitor 8 and 9 are discharged or at a minimum charge state an instant after the transition at the beginning of a period.

An instant after the voltage at output 5 makes a transition from a low to a high value at the beginning of a period, the capacitors 8 and 9 begin charging through the resistor 13. Thus, a voltage proportional to the charging current appears across the resistor 13. The potential difference across the resistor 13 is positive with respect to ground. Thus, the diode 12 is reverse biased and essentially out of the circuit during the charging interval.

The transition time from low to high at the output 5 occurs in essentially zero time. Thus, during the transition time, the capacitors 8 and 9 remain essentially discharged. Immediately after the transition, the capacitors 8 and 9 remain essentially discharged, thus very nearly the entire V+ appears across the resistor 13. As the capacitors begin to charge the voltage between terminals 11 and 5 increases and current through and thus voltage across resistor 13 decays exponentially to zero as shown in FIG. 4.

Upon reaching 75% of the period, the output at port 5 makes an essentially instantaneous transition form a high to a low value. The capacitors 6 and 9 accumulated charge during the first 75% of the period. The voltage is proportional to the charge divided by the equivalent capacitance. Terminal 5 is more positive than terminal 11. Making a transition to a low value place port 5 at essentially ground potential. The diode 12 prevents the voltage at 11 from dropping more than a few tenths of a volt below ground level. This substantially discharges the capacitors 6 and 9. During the remainder of the period, the potential difference between the terminals 5 and 11 remains at zero volts. Thus no current flow through the capacitors 6 and 9 or through the resistor 13.

When the voltage at the input port 14 as represented by the waveform of FIG. 4 falls below the threshold value of MOSFET 3 at input port 14 the MOSFET turns off. As indicated previously, with MOSFET 3 off a logical zero is placed at the output port for sampling by the computer. The computer samples the input port while the output port is at a logical high voltage value. During sampling the input port initially contains a logical one indicating that the voltage at the input port is above threshold and MOSFET 3 is conducting. Once MOSFET 3 turns off the input port contains a logical zero. Sampling continues for 75% of the period when as illustrated the output switches from high to low at which time sampling stops. The time interval from the beginning of the waveform period until the input port contains a logical zero is stored by the computer and indicates in relative terms the value of capacitive component 9 when compared to other sampled times. Over repeated samplings for continuously occurring output waveforms as shown in FIG. 3 the time information relates the condition of capacitive component 9 where a change in time interval provides a good estimation a resultant change in capacitive component 9. Specifically, a salver capacitance impedance results in a shorter time interval between time 0% of the waveform and the threshold cut off.

Figure 2:
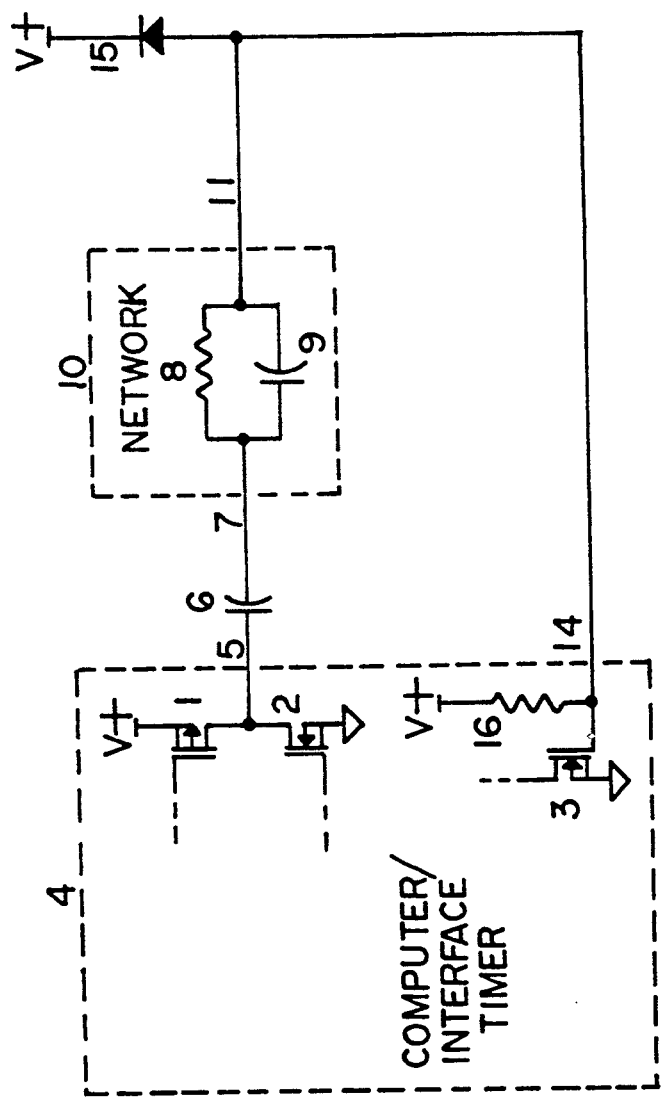
FIG. 2 is a schematic view of another embodiment required to practice the alternative method of this invention connected to a common moisture, or other capacitance sensor and microcontroller-type computer.

FIG. 2 illustrates the an alternative or second embodiment of this invention for use with a computer using internal pull up resistors 16 (shown symbolically as a single resistor) at the input port 14. As before capacitor 6 is connected between output port 5 and the input lead 7 of sensor 10. Again, sensor lead 11 is connected to input port 14 of computer 4. However, in the alternative embodiment, a diode 16 is connected between the V+ voltage source and lead 11 of the sensor.

Figure 5:
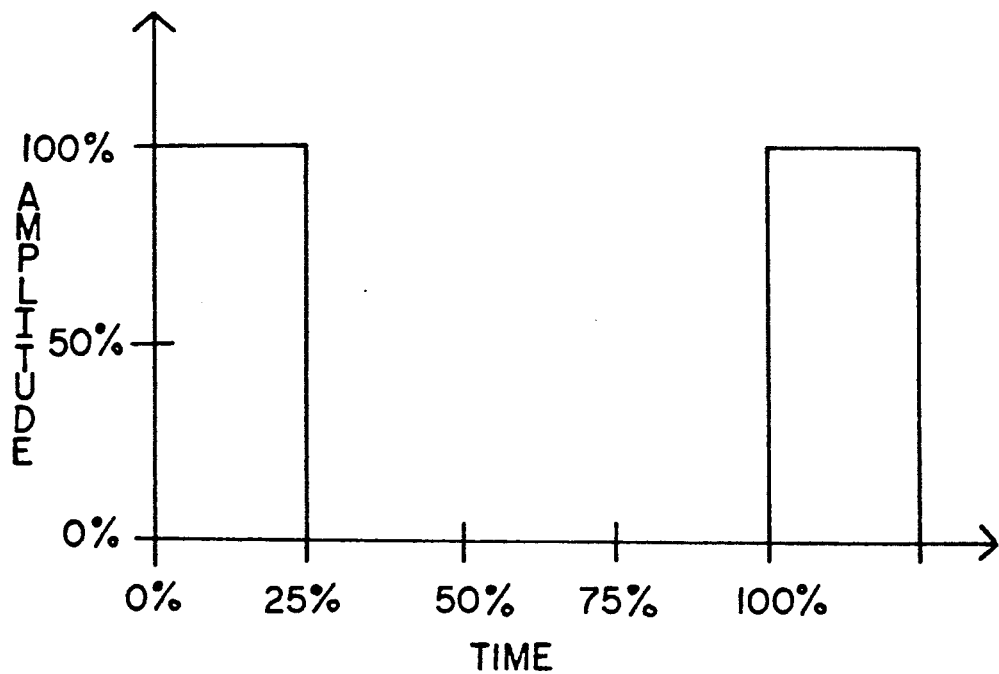
FIG. 5 is a time vs. amplitude diagram of a waveform appearing at the output port of the computer practicing the alternative embodiment of this invention.
Figure 6:
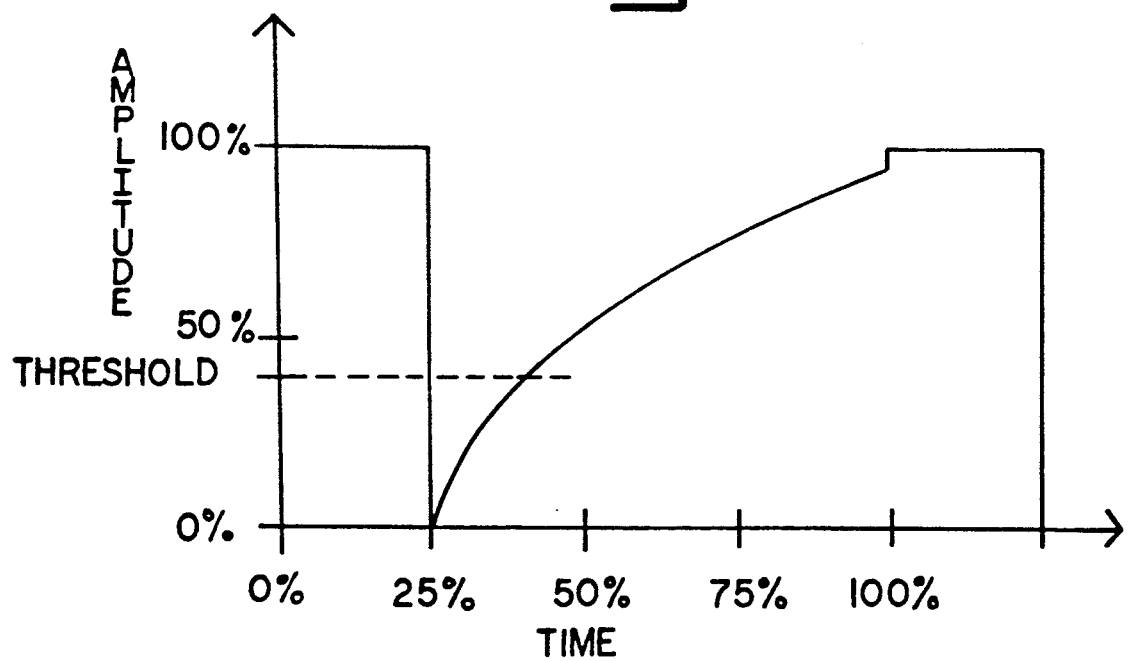
FIG. 6 is a time vs. amplitude diagram of a representative waveform appearing at the input port of the computer practicing the alternative embodiment of this invention.

An illustration of the output waveform used in the alternative embodiment is illustrated in FIG. 5. FIG. 6 illustrates the resultant input waveform present at computer input port 14 in response to the output waveform of FIG. 5 when used with the circuitry of FIG. 2. As with the first embodiment at the beginning of a period output port 5 makes a transition from a low to high voltage. Assume that the capacitors accumulated charge during the previous period of operation. This transition from low to high discharges capacitor 6 and capacitive component 9 through diode 15. In effect, the transition transfers the capacitor connection 8 from ground to V+. The charge in a capacitor cannot change instantly without an infinite current. Thus, the charge stored in the capacitors does not substantially change during the transition interval of the voltage at the computer's output port 5.

During charging, terminal 5 of the capacitor 9 is grounded. Charging terminals 7 and 11 to rise to a voltage above ground. That is, terminal 11 is more positive than terminal 5. The transition of the computer 4 output port from a low voltage to a high voltage connects 5 to V+. In effect, this connects the end of the capacitor, previously at approximately ground potential to V+. This add the voltage appearing between terminals 11 and 5 to supply voltage V+. Were it not for the diode 15, this voltage would exceed V+ by a factor of up to two. The diode clamps terminal 11 to the supply voltage V+. This discharges the capacitor combination to a minimum value V' as shown in FIG. 6 in anticipation of the beginning of the charging interval beginning at 25% of the period.

For the remainder of the first 25% of the period, the potential difference between terminals 5 and 11 remains zero. Both terminals are at a potential of V+. Similarly, no current flows through the pull-up resistor since there is no potential difference across it. At 25% of the period the output port 5 makes a transition from its high voltage level to its low voltage level and remains low for approximately 75% of the waveform. The low voltage level as indicated in FIG. 6 causes current flow from the voltage source through pull up resistor 16 causing MOSFET 3 to conduct placing a logical one at input port 14 for sampling by the computer. With a low input voltage, capacitor 6 and capacitive component 9 begin to charge to the supply voltage (V+) through pull up resistor 16 at input port 14. Since the diode is reverse biased, the capacitors 6 and 9 begin charging in an exponential manner toward V+ as shown in FIG. 6 by the current flowing through the pull-up resistor. When the voltage at input port 14 reaches the threshold value transistor 3 turns on indicating a logical one value to the computer. At 100% of the period, the output port 5 makes a transition from a logical low voltage level to a logical high voltage level thus beginning the next waveform. As before computer 4 continually samples the logical level of input port 14 between 25% and 75% and monitors a time interval between change in logical states and thereby reflecting a change in capacitive impedance to the computer.

It should be understood that while the invention is disclosed for use in detecting a capacitive change in a sensor for illustrating purposes, such should not be considered a limitation on the invention. It should also be understood that this invention is not to be limited to the precise form disclosed but may be modified within the scope of the appended claims.

I claim:

1. A device for indicating change in a capacitive value in a load comprising, a means for outputting a periodic waveform having a high voltage portion and a low voltage portion to said load, a capacitance connected between said output means and said load, said load connected between said output means and a means for monitoring the voltage of said load, a diode and a resistor being connected between said monitoring means and ground potential, wherein said load includes a capacitive component and a resistive component, said capacitive component charges through said resistor during said high voltage portion of said waveform, wherein said monitoring means indicates when said charging capacitive component is at a predetermined voltage, said capacitive component discharging during said low voltage portion of said waveform, said monitoring means further constituting means for timing the time for said capacitance to charge to said predetermined voltage, wherein a change in charge time indicates a change in said capacitance value.

2. A device for indicating change in a capacitive value in a load comprising, a means for outputting a periodic waveform having a high voltage portion and a low voltage portion to a load, a capacitance connected between said output means and said load, said load connected between said output means and a means for monitoring the voltage of said load, a register connected between a positive voltage source and said monitoring means, a diode being connected between said monitoring means and said positive voltage source, wherein said load includes a capacitive component and a resistive component, said capacitive component discharges through said resistor during said high voltage portion of said waveform, wherein said monitoring means indicates when said charging capacitive component is at a predetermined voltage, said capacitive component charges during said low voltage portion of said waveform, said monitoring means further constituting means for timing the time for said capacitance component to charge to said predetermined voltage wherein a change in charge time indicates a change in said capacitance value.

* * * * *